(12) United States Patent
Ho

(10) Patent No.: US 12,708,022 B2
(45) Date of Patent: Aug. 11, 2026

(54) INTERCONNECT STRIPS

(71) Applicant: TEXAS INSTRUMENTS INCORPORATED, Dallas, TX (US)

(72) Inventor: Chih-Chien Ho, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 792 days.

(21) Appl. No.: 17/965,819

(22) Filed: Oct. 14, 2022

(65) Prior Publication Data

US 2024/0128094 A1 Apr. 18, 2024

(51) Int. Cl.

| | |
|---|---|
| ***H10W 70/40*** | (2026.01) |
| ***H10W 74/01*** | (2026.01) |
| ***H10W 74/10*** | (2026.01) |
| ***H10W 90/00*** | (2026.01) |
| *H10W 72/50* | (2026.01) |

(52) U.S. Cl.

CPC ....... *H10W 74/014* (2026.01); *H10W 70/421* (2026.01); *H10W 74/016* (2026.01); *H10W 74/114* (2026.01); *H10W 90/753* (2026.01); *H10W 90/811* (2026.01); *H10W 72/5445* (2026.01); *H10W 72/5449* (2026.01); *H10W 72/5473* (2026.01); *H10W 90/756* (2026.01)

(58) Field of Classification Search

CPC . H01L 21/561; H01L 21/565; H01L 23/3121; H01L 23/49541; H01L 23/49575; H01L 24/48; H01L 24/49; H01L 2224/48137; H01L 2224/48245; H01L 2224/49113; H01L 2224/49171; H01L 2224/49175; H01L 21/4842; H01L 23/49551; H01L 24/20; H01L 23/3107

See application file for complete search history.

(56) References Cited

U.S. PATENT DOCUMENTS

| | | | |
|---|---|---|---|
| 4,137,546 A | 1/1979 | Frusco | |
| 4,641,418 A | 2/1987 | Meddles | |
| 5,723,899 A | 3/1998 | Shin | |
| 8,487,420 B1 * | 7/2013 | Hwang | H01L 25/03 257/777 |
| 9,659,842 B2 | 5/2017 | Jow | |
| 2007/0281397 A1 | 12/2007 | Lo | |
| 2012/0223423 A1 | 9/2012 | Hsu et al. | |
| 2017/0104149 A1 * | 4/2017 | Ugge | H10N 50/80 |
| 2021/0193587 A1 * | 6/2021 | Yada | H01L 21/768 |

* cited by examiner

*Primary Examiner* — Elias Ullah
(74) *Attorney, Agent, or Firm* — Ronald O. Neerings; Frank D. Cimino

(57) ABSTRACT

A method for forming integrated circuit (IC) packages includes mounting dies on a strip of interconnects and applying wire bonds in regions of the strip of interconnects proximate to mold shields. The method also includes adjusting the mold shields of the strip of interconnects. The method includes flowing a mold compound on the strip of interconnects to form a strip of IC packages. Mold injection pressure causes the mold compound to flow from a first end of the strip of interconnects across the strip of interconnects to a second end of the strip of interconnects, and the mold shields impede the flow of the mold compound through the regions of the strip of interconnects proximate to the mold shields. The method includes singulating the strip of IC packages to form the IC packages.

20 Claims, 8 Drawing Sheets

INTERCONNECT STRIPS

TECHNICAL FIELD

This disclosure relates to strips of interconnects for integrated circuit (IC) packages.

BACKGROUND

An interconnect (alternatively referred to as a lead frame) is a metal structure inside an integrated circuit (IC) package that carries signals from a die to the outside. The interconnect includes a die pad, where the die is placed, surrounded by leads, metal conductors leading away from the die to the external circuits. The end of each lead closest to the die ends in a bond pad. Small wire bonds connect the die to each bond pad. Mechanical connections fix these parts into a rigid structure, which makes the whole interconnect easy to handle automatically.

The die is glued or soldered to the die pad inside the interconnect, and then wire bonds are attached between the die and the bond pads to connect the die to the leads. In a process called encapsulation, a plastic case is molded around the lead frame and die, exposing only the leads. The leads are cut off outside the plastic body and any exposed supporting structures are cut away. The external leads are then bent (formed) to the desired shape. In various examples, interconnects are employed to manufacture a quad flat no-leads package (QFN), a quad flat package (QFP), or a dual in-line package (DIP).

SUMMARY

A first example relates to a method for forming IC packages. The method includes mounting dies on a strip of interconnects. The method also includes applying wire bonds in regions of the strip of interconnects proximate to mold shields. The method includes adjusting the mold shields of the strip of interconnects and flowing a mold compound on the strip of interconnects to form a strip of IC packages. Mold injection pressure causes the mold compound to flow from a first end of the strip of interconnects, across the strip of interconnects to a second end of the strip of interconnects, and the mold shields impede the flow of the mold compound through the regions of the strip of interconnects proximate to the mold shields. The method includes singulating the strip of IC packages to form the IC packages.

A second example relates to a strip of IC packages. The strip of IC packages includes a strip of interconnects comprising mold shields arranged in a center region of the strips of interconnects. The mold shields form a right angle or an acute angle. The strip of IC packages also includes dies mounted on the strips of interconnects and wire bonds in the center region of the strips of interconnects. The strip of IC packages includes a mold compound encapsulating the strip of interconnects, and the mold shields protrude out of the mold compound.

DETAILED DESCRIPTION

This description relates to a strip of IC packages and a method for forming integrated circuit (IC) packages from a strip of interconnects. The method includes mounting dies on the strip of interconnects. The strips of interconnects are a component of a frame of strips of interconnects. Wire bonds are applied to couple the dies to the interconnect and to couple dies together. In some examples, some of the wire bonds extend in a direction transverse (or nearly transverse) to a direction of a mold flow (e.g., a direction of flow of a mold compound).

The strips of interconnects include mold shields at a center region of the strips of interconnects. The mold shields are adjusted (e.g., bent) to form a right angle or an acute angle, such as an angle of 87.5 degrees with a 2.5 degree tolerance. A mold compound (e.g., plastic) is flowed on the strips of interconnects in a mold flow operation. The strips of interconnects are oriented horizontally, such that mold injection pressure causes the mold to flow from a first end of the strip of interconnects, across the strip of interconnects and to a second end of the strip of interconnects that opposes the first end of the strip of interconnects, and the mold shields impede the flow of the mold through regions of the strip of interconnects proximate to the mold shields. The mold shields protrude out from the mold compound. Accordingly, the mold shields operate as a marker for singulation.

The mold compound hardens to encapsulate the strip of interconnects and to form a strip of IC packages. In response to the hardening, the strip of IC packages is singulated to form IC packages. The singulation includes laser sawing the strip of IC packages with a laser saw. In some examples, two passes of the laser saw are implemented to remove the mold shields. By implementing the strip of interconnects, the frame of strips of interconnects is increased in density. More particularly, the mold shields obviate the need for other features, such as side gates, such that the strips of interconnects employ less space, thereby allowing for the increased in density. For instance, in some examples, there are 20 or more (e.g., 22) strips of interconnects in the frame of interconnects, and there are 7 interconnects on each strip of interconnects. Thus, there are 154 singulatable IC packages in the frame of strips of IC packages that utilize these strips of interconnects.

Figure 1:
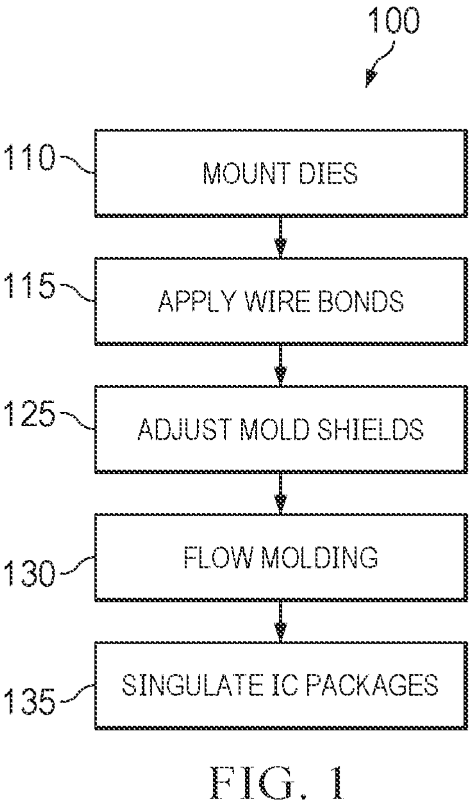
FIG. 1 illustrates a flowchart of an example method for singulating IC packages.

FIG. 1 illustrates a flowchart of an example method 100 for forming IC packages. The IC packages are formed from singulating IC packages from a strip of IC packages formed with a strip of interconnects. In some examples, the strip of interconnects is a component of a frame (array) of interconnects. The strip of interconnects is alternatively referred to as a bar of interconnects. In some examples, the strip of interconnects are a high density (HyDE) strip of interconnects. The interconnects in the strip of interconnects include pads for dies and pins for coupling the IC packages to external components. At 110, dies are mounted on the strip of interconnects. In some examples, a single die is mounted on an interconnect of the strip of interconnects. In other examples, multiple dies are mounted on an interconnect of the strip of interconnects. The dies are mounted on the pads of the interconnects of the strip of interconnects.

The interconnects in the strip of interconnects include mold shields situated in a center region of the strip of interconnects. The mold shields are formed as tabs that extend parallel to a backplane of the strip of interconnects. At 115, wire bonds are applied to electrically couple the dies to the interconnects of the strip of interconnects. In some examples, the wire bonds also electrically couple dies of a respective interconnect in the strip of interconnects. The wire bonds are positioned in the center region of the strip of interconnects. In some examples, the wire bonds, or some subset thereof, for each interconnect of the strip of interconnects are proximate to the corresponding mold shield.

At 125, the mold shields are adjusted. Adjustment of the mold shields includes bending the mold shields. In some examples, the mold shields are bent to a right angle or an acute angle. More specifically, the mold shields are bent to form an angle of 87.5 degrees with a tolerance of 2.5 degrees. Thus, the angle in the mold shield is in a range of 90 degrees to 85 degrees.

At 130, a mold compound, such as plastic, is flowed on the strip of interconnects to form a strip of IC packages in a mold flow operation. The interconnects are arranged horizontally, such that mold injection pressure pulls the mold compound across the strip of interconnects. The mold shields imped the mold flow (e.g., the flow of the mold compound) at the center region of the strip of interconnects. Moreover, the mold flow is unimpeded at a periphery of the strip of interconnects. This impeding of the mold flow reduces a pressure of the mold compound on the wire bonds, because the wire bonds are also at the center region of the strip of interconnects. Moreover, the mold compound flows and hardens and encapsulates the strip of interconnects to form the strip of IC packages. The mold shields protrude out of the mold compound, such that a location of the mold shields is readily identified.

At 135, IC packages in the strip of IC packages are singulated. Singulation of the strip of the IC packages includes applying a laser saw to the strip of IC packages. In some examples, the mold shields are removed with two passes of the laser saw. In some examples, the resultant IC packages are dual in-line IC packages. In other examples, the resultant IC packages are dual flat no leads (DFN) IC packages.

Utilization of the mold shields obviates the need for features such as side gates to control the flow of the mold compound. Instead, the mold shields impede the flow of mold compound, such that a higher density of interconnects are enabled. For example, in a conventional approach using side gates, there are usually 16 strips of interconnects in a frame of strips of interconnects. Conversely, by including the mold shields, the number of interconnects in the strip of interconnects is increased to 20 strips of interconnects or more (e.g., 22 strips of interconnects) in a frame of strips of interconnects.

Figure 2:
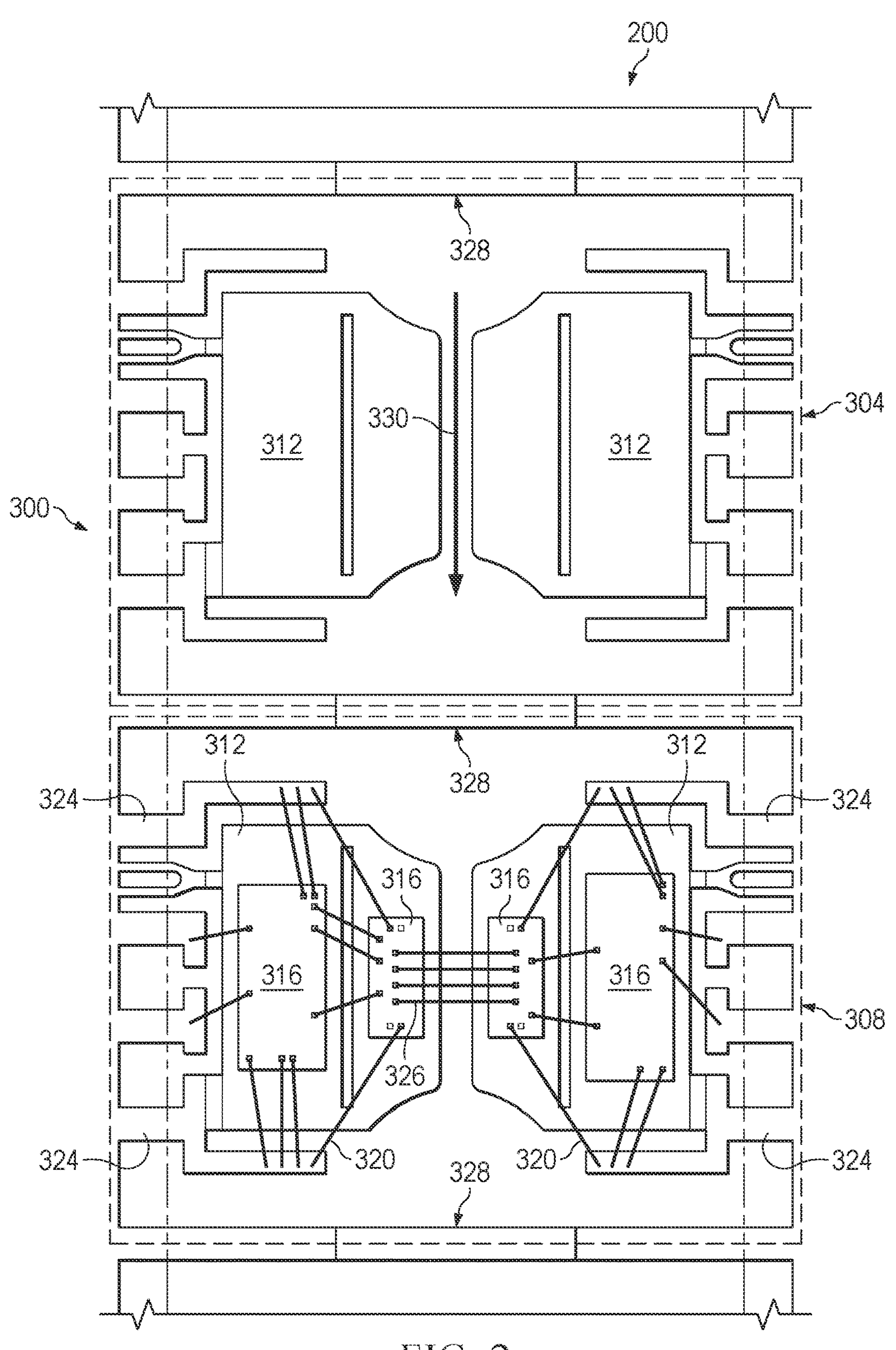
FIG. 2 illustrates a first stage of an example method for adjusting mold shields and for flowing a mold compound on a strip of interconnects.
Figure 3A:
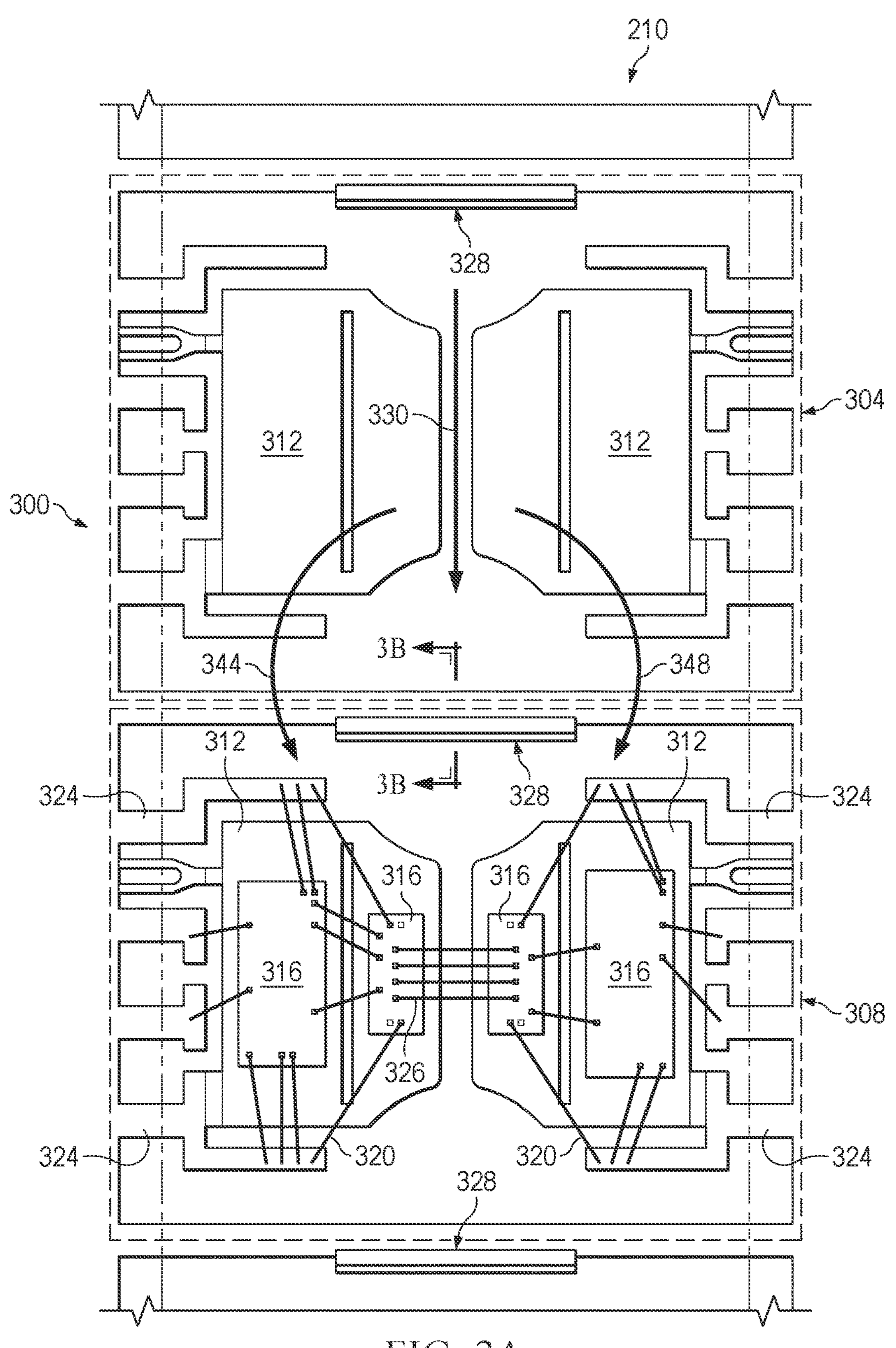
FIG. 3A illustrates a second stage of the example method for adjusting mold shields and for flowing a mold compound on a strip of interconnects.
Figure 3B:
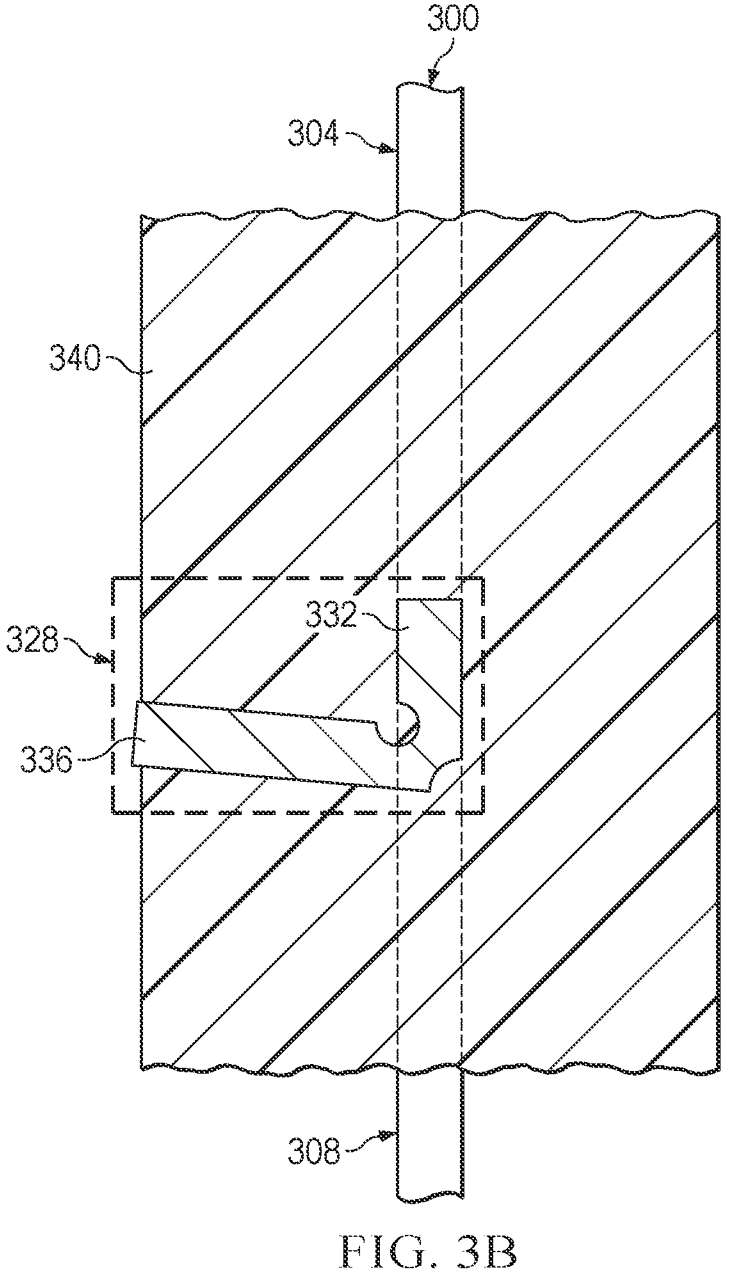
FIG. 3B illustrates a cross-sectional view of the strip of interconnects of FIG. 3A.

FIGS. 2, 3A and 3B illustrate stages of a method for adjusting a mold shield in a strip of interconnects and for flowing a mold compound. For purposes of simplification of explanation, FIGS. 2, 3A and 3B employ the same reference numbers to denote the same structure.

At 200, in a first stage, as illustrated in FIG. 2, a strip of interconnects 300 is provided. The strips of interconnects 300 is a high density (HyDe) strip of interconnects. The strip of interconnects includes a first interconnect 304 and a second interconnect 308. The first interconnect 304 and the second interconnect 308 include pads 312 for mounting dies 316. In the example illustrated, 4 dies 316 have been mounted on the pads 312 of the second interconnect 308, but there are no dies mounted on the first interconnect 304.

The second interconnect 308 includes wire bonds 320 (only some of which are labeled) that electrically couple the dies 316 to leads 324 (only some of which are labeled) of the second interconnect 308. Some wire bonds 326 couple the dies 316 together. These wire bonds 326 extend in a direction transverse or nearly (e.g., a tolerance of +/−2%) transverse to a direction of mold flow indicated by an arrow 330 (e.g., a direction of flow of a mold compound).

The first interconnect 304 and the second interconnect 308 include a mold shield 328. The mold shield 328 is a bendable tap arranged on and end and center of a periphery of the first interconnect 304 and the second interconnect 308. The wire bonds 326 that extend in the direction transverse to the mold flow direction 330 are located in a center region of the second interconnect 308. In an un-bended condition The mold shields 328 extend in a direction parallel to a backplane of the strip of interconnects 300 and in a direction parallel to the mold flow direction 330. In some examples, in the un-bended condition, the mold shields 328 are 1.57 millimeters (mm) long, such that the first interconnect 304 and the second interconnect 308 are spaced about 1.57 mm apart.

At 210, in a second stage, as illustrated in FIGS. 3A and 3B, the mold shields 328 are adjusted to imped the flow of the mold compound. FIG. 3B illustrates a cross-sectional view of the interconnects 300 taken along line b-b. As illustrated in FIG. 3B, the adjustment includes bending the mold shield 328 to form an angle between 90 degrees and 85 degrees. Thus, in some examples, the mold shield 328 is bent to form an 87.5 degrees, with a tolerance of 2.5 degrees. In the bent condition, the mold shield 328 includes a base portion 332 and a bent portion 336. Thus, the mold shield 328 is bent such that the bent portion 336 is at an angle between 90 degrees and 85 degrees with respect to the base portion 332. The base portion 332 has a length, for example of about 0.5 millimeters (mm). Moreover, the bent portion 336 has a length of about 1.07 mm. Unless otherwise stated, in this description, 'about' preceding a value means+/−10 percent of the stated value.

Also at 210, a mold compound 340 illustrated in FIG. 3B flows in the mold flow direction 330. In the example illustrated, it is presumed that the strip of interconnects 300 is oriented horizontally, such that mold injection pressure draws the mold compound from a first end of strip of interconnects 300 across the strip of interconnects 300 and to a second end (opposing the first end) of the strip of interconnects 300, and in the direction of the mold flow direction 330. As illustrated in FIG. 3A the flow of the mold compound 340 is impeded by the mold shield 328 and diverted to directions indicated by the arrows 344 and 348. This impeding and redirection reduces a compressive force of the flowing mold compound 340 in the center region of the strip of interconnects 300. Accordingly, the compressive force applied to the wire bonds 326 is reduced, thereby reducing a probability that the mold flow will damage the wire bonds 326.

As illustrated in FIG. 3B, after hardening, the mold compound 340 encapsulates the strip of interconnects 300 to form a strip of IC packages. The mold compound 340 has a thickness of about 1.016 mm on both sides of the strip of interconnects 300. Accordingly, the thickness of the mold compound 340 on one side of the strip of interconnects is less than a length of the bent portion 336 of the mold shield 328, such that a portion of the mold shield 328 protrudes out of the mold compound 340, after the mold compound has hardened.

As demonstrated in FIGS. 3A and 3B, the mold shields 328 reduce the compressive force applied by the mold compound 340 to the wire bonds 326 that extend transverse to the mold flow direction 330. This obviates the need for relatively large features such as side gate that are employed in a conventional approach. Accordingly the number strips of interconnects 300 in a frame of strips of interconnects is increased.

Figure 4:
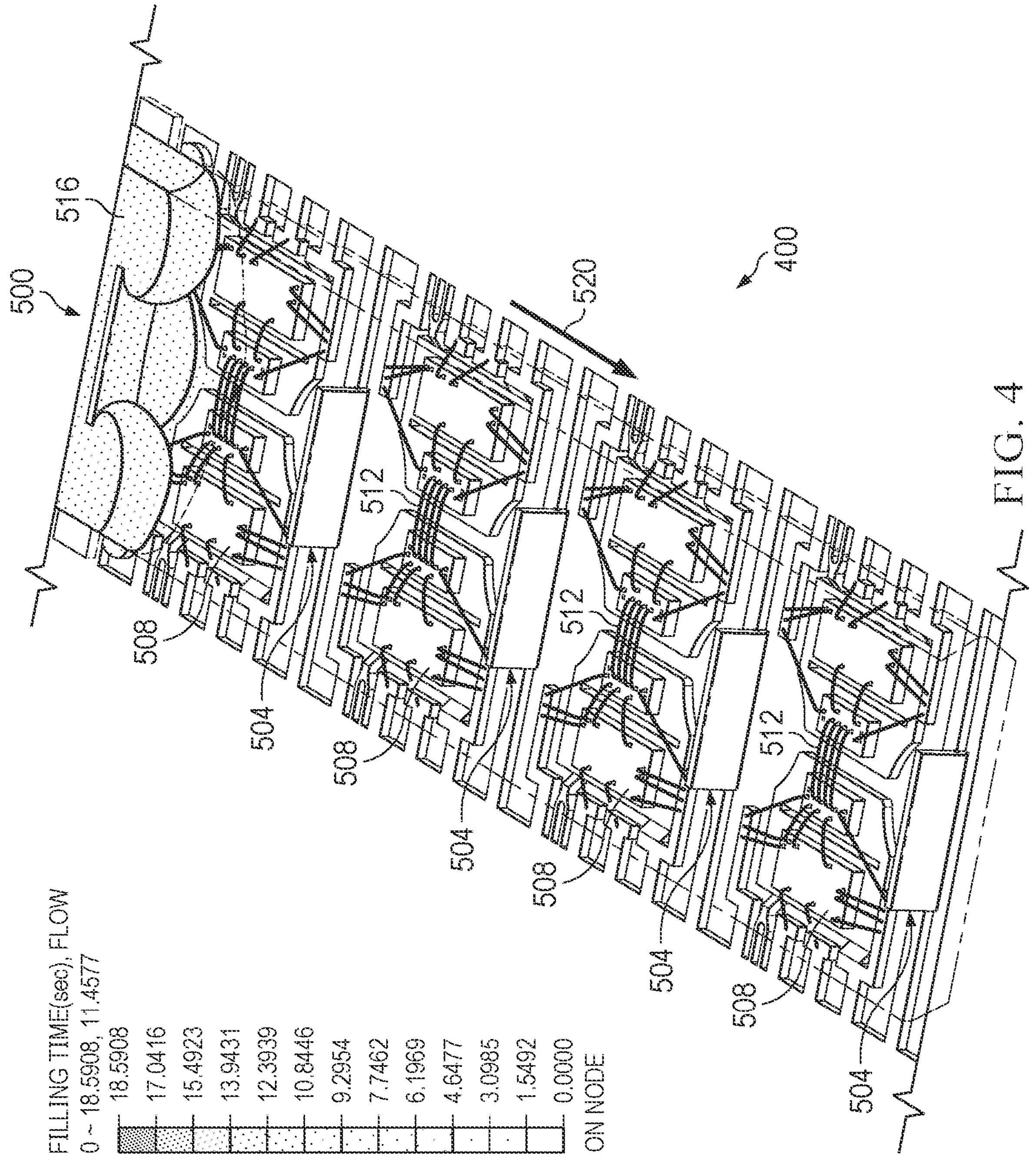
FIG. 4 illustrates a first stage of an example method for encapsulating a strip of interconnects in a mold compound and for singulating IC packages.
Figure 5:
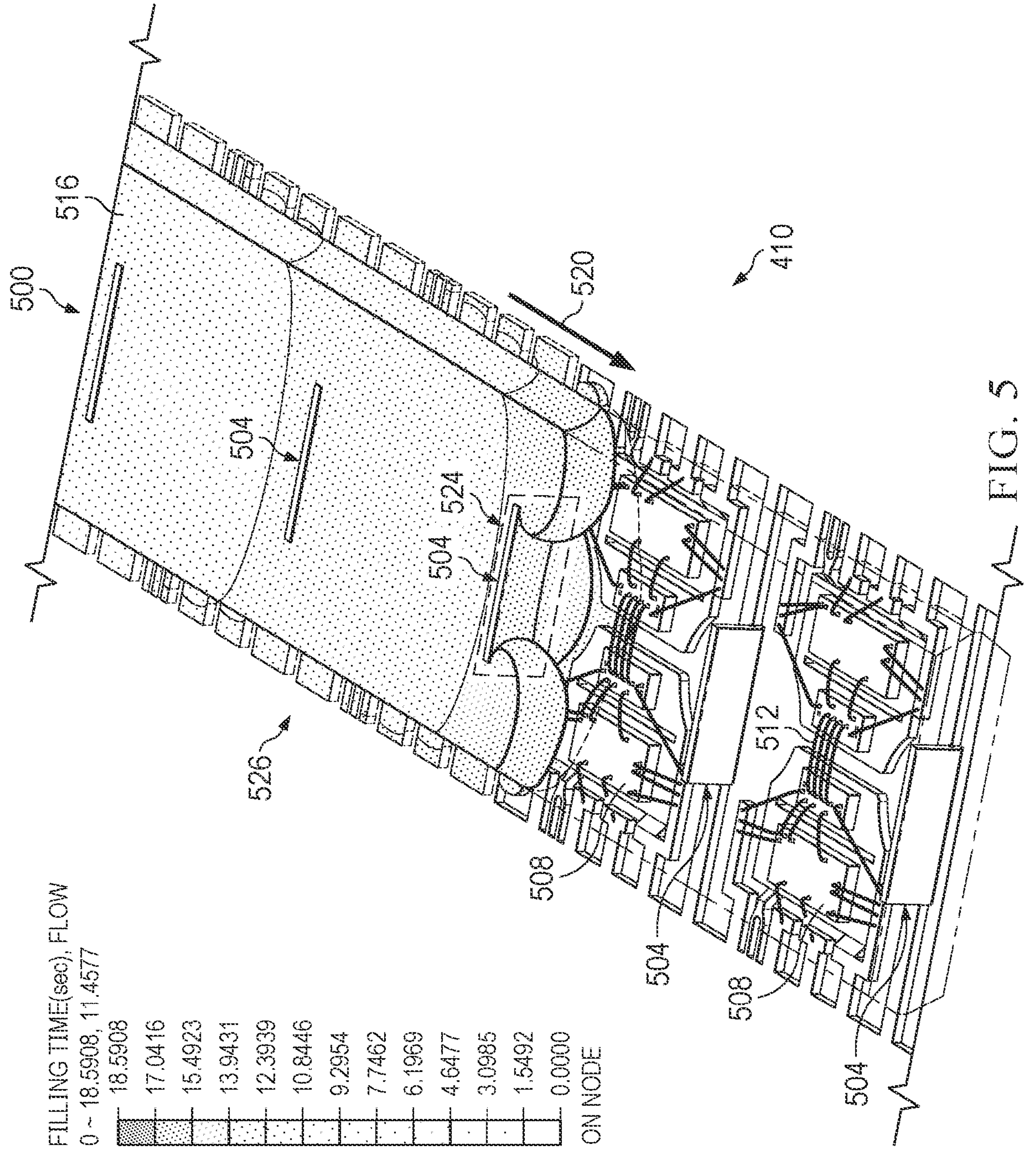
FIG. 5 illustrates a second stage of the example method for encapsulating a strip of interconnects in a mold compound and for singulating IC packages.
Figure 6:
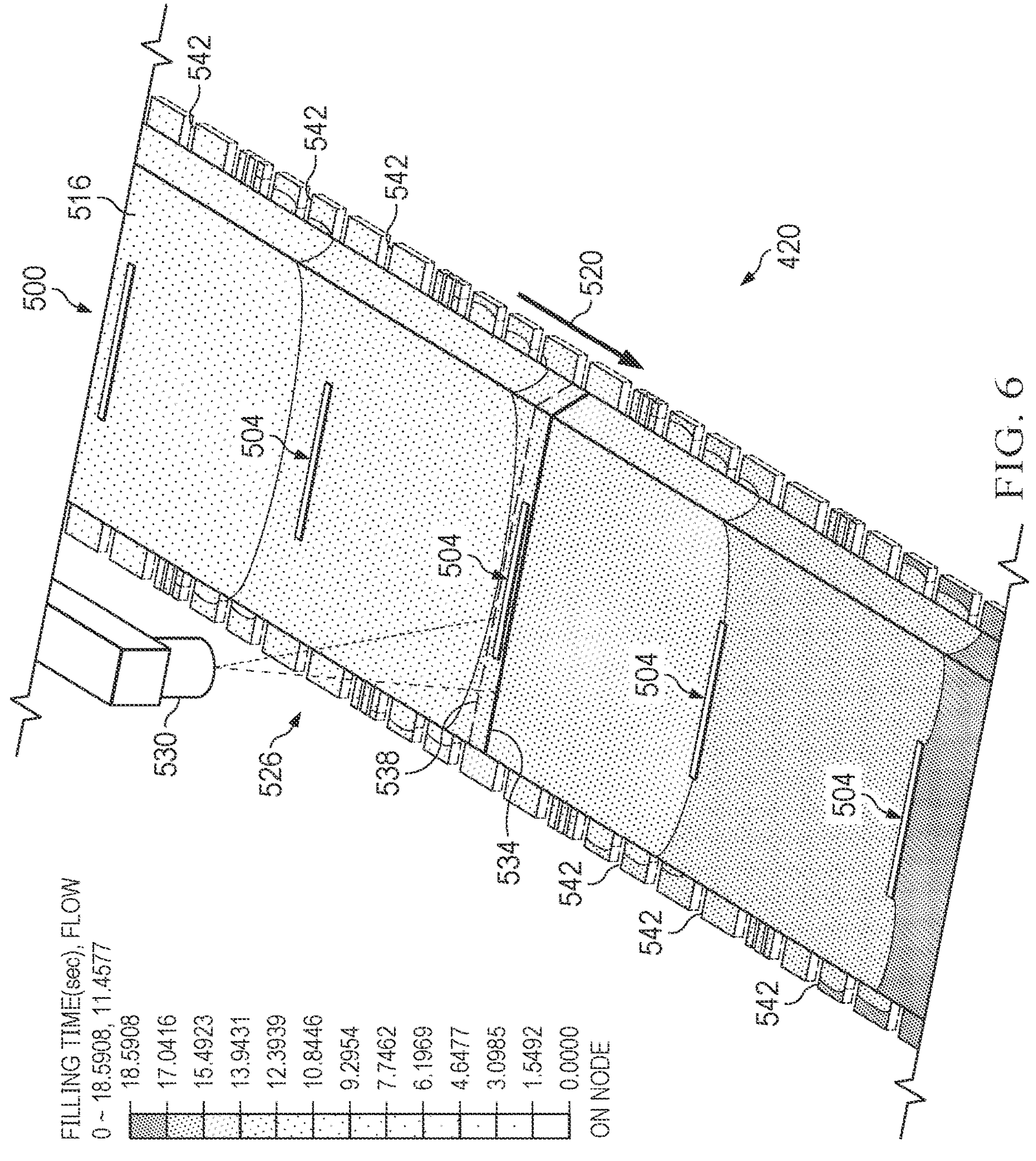
FIG. 6 illustrates a third stage of the example method for encapsulating a strip of interconnects in a mold compound and for singulating IC packages.

FIGS. 4-6 illustrate stages of a method for encapsulating a strip of interconnects in a mold compound and for singulating IC packages. For purposes of simplification of explanation, FIGS. 4-6 employ the same reference numbers to denote the same structure. Moreover, FIGS. 4 and 5 include a scale to show the flow of a mold compound flow as a function of time.

At 400, in a first stage, as illustrated in FIG. 4, a strip of interconnects 500 is provided. The strip of interconnects 500 is employable to implement the strip of interconnects 300 illustrated in FIGS. 2, 3A and 3B. The strip of interconnects 500 include mold shields 504 that are in the bent condition. The strip of interconnects also includes dies 508 that are coupled with wire bonds 512. At 400, a mold compound 516 flows in a mold flow direction indicated by an arrow 520. The wire bonds 512 extend in a direction transverse (or nearly transverse) to the mold flow direction 520. The strip of interconnects 300 is oriented horizontally, such that the mold flow direction 520 is across the strip of interconnects 300, and mold injection pressure causes the mold compound 516 to flow.

At 410, in a second stage, as illustrated in FIG. 5, the mold compound 516 has continued to flow in the mold flow direction 520. However, as illustrated, the mold shields 504 impedes the flow of the mold compound near a center region of the strip of interconnects 500. More particularly, as illustrated in FIG. 5, in a region 524 below a mold shield 504, there is less mold compound 516 in a region proximate to the mold shields 504 (the center region) than on peripheral regions of the strip of interconnects 500. Thus, this reduction in mass reduces a compression force applied by the flowing mold compound. Further, as illustrated, the wire bonds 512 are proximate to the mold shields 504 and to the region 524. Thus, the compressive force of the mold compound 516 applied to the wire bonds 512 proximate to the region 524 and the mold shields 504 is similarly reduced. This reduces a chance that the flowing of the mold compound 516 will damage the wire bonds 512. Additionally, as demonstrated, the mold shields 504 are sufficiently long to protrude beyond the mold compound 516. The mold compound hardens, such that the strip of interconnects 500 is converted to a strip of IC packages 526.

Accordingly, as demonstrated in FIGS. 4 and 5, the mold shields 504 reduce the compressive force applied by the mold compound 516 to the wire bonds 512 that extend transverse to the mold flow direction 520. This obviates the need for relatively large features such as side gates that are employed in a conventional approach. Accordingly the number of interconnects in the strip of interconnects 500 is increased.

At 420, in a third stage, as illustrated in FIG. 6, the strip of IC packages 526 is singulated to provide IC packages. To singulate the strip of IC packages, a laser saw 530 makes a first cut 534 below a mold shield 504 and a second cut 538 above the mold shield 504 (or vice versa) for each mold shield 504. Moreover, the mold shields 504 operate as guides for aligning the laser saw 530. In this manner, the mold shields 504 are removed without the laser saw 530 cutting directly through a mold shield 504. The resultant IC packages are dual in-line IC packages with pins 542 (only some of which are labeled) on opposing sides.

Figure 7:
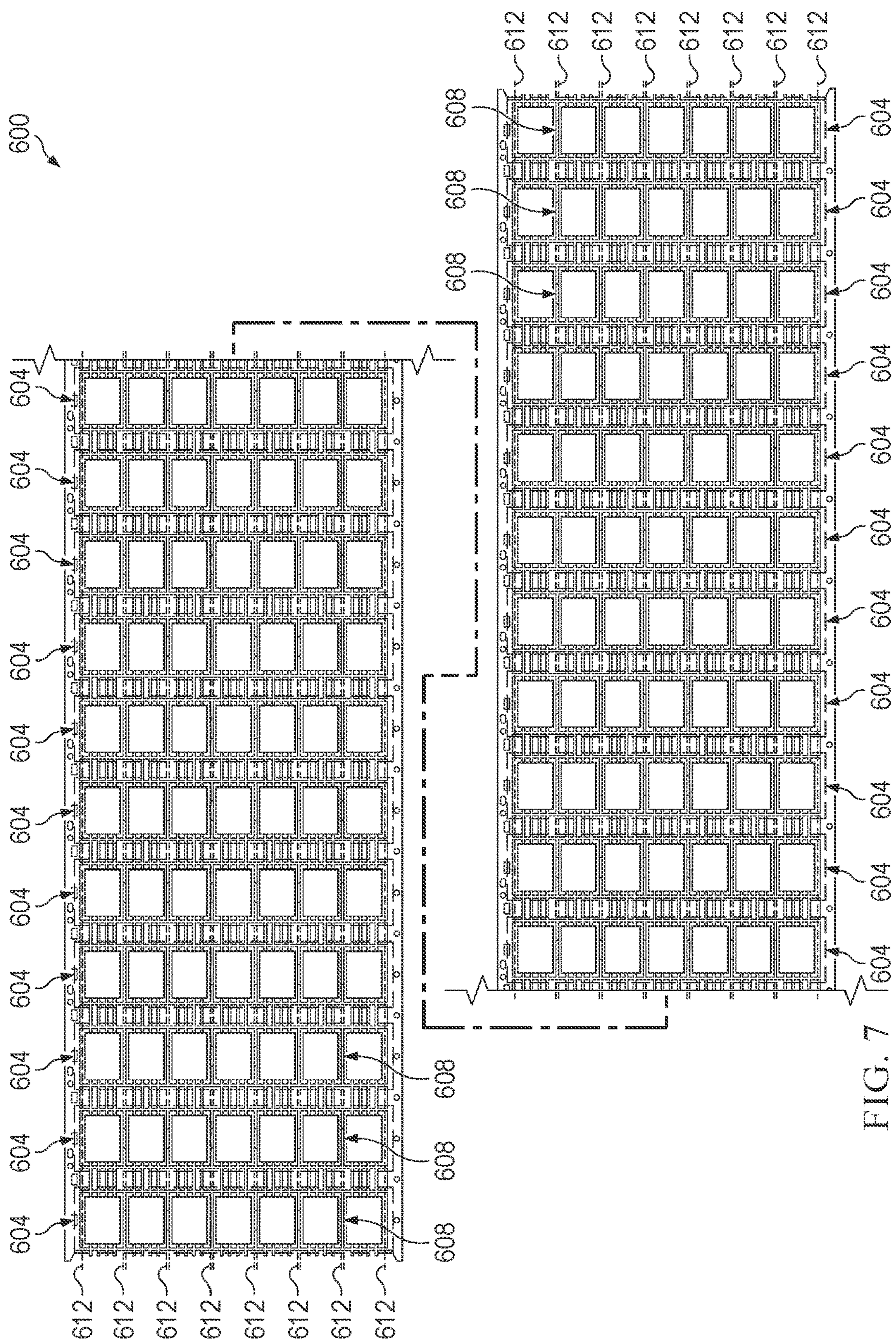
FIG. 7 illustrates a frame of strips of IC packages.

FIG. 7 illustrates a frame 600 of strips of IC packages 604. The strips of IC packages 604 are employed to implement the strip of IC packages 526 of FIGS. 5-6. Each interconnect includes a mold shield 608 (only some of which are labeled) to impede the flow of a mold compound encapsulating the strips of IC packages 604. The strips of IC packages 604 have interdigitated pins. Moreover, in the example illustrated, there are 7 interconnects in each strip of IC packages 604, and there are 22 strips of IC packages 604 in the frame 600 of strips interconnects of IC packages 604, such that there are 154 IC packages 604 in the frame 600 of strips of IC packages 604.

IC packages are formed by singulating the strips of IC packages 604. More specifically, a laser saw (e.g., the laser saw 530 of FIG. 6) makes cuts as indicated by the lines 612. Moreover, by avoiding the use of features such as side gates, the number of strips of IC packages 604 can be increased to 22, such that the frame 600 of strips of interconnects is employable to singulate the 154 IC packages.

Modifications are possible in the described embodiments, and other embodiments are possible, within the scope of the claims.

What is claimed is:

1. A method for forming integrated circuit (IC) packages comprising:

- mounting dies on a strip of interconnects;
- applying wire bonds in regions of the strip of interconnects proximate to mold shields;
- adjusting the mold shields of the strip of interconnects;
- flowing a mold compound on the strip of interconnects to form a strip of IC packages, wherein mold injection pressure causes the mold compound to flow from a first end of the strip of interconnects, across the strip of interconnects and to a second end of the strip of interconnects, and the mold shields impede the flow of the mold compound through regions of the strip of interconnects proximate to the mold shields; and
- singulating the strip of IC packages to form the IC packages.

2. The method of claim 1, wherein flow of the mold compound is unimpeded at a region proximate to a periphery of the strip of interconnects.

3. The method of claim 2, wherein the mold compound is plastic.

4. The method of claim 2, wherein the mounting further comprises mounting a plurality of dies corresponding to a respective IC package of the IC packages.

5. The method of claim 4, wherein the applying further comprises applying wire bonds to couple the dies corresponding to the respective IC package together.

6. The method of claim 4, wherein the wire bonds that couple the dies of the respective IC package together extend in a direction nearly transverse to a direction of the flow of the mold compound.

7. The method of claim 1, wherein the strip of interconnects comprises die pads for the dies.

8. A method for forming integrated circuit (IC) packages comprising:

mounting dies on a strip of interconnects;

applying wire bonds in regions of the strip of interconnects proximate to mold shields;

adjusting the mold shields of the strip of interconnects;

flowing a mold compound on the strip of interconnects to form a strip of IC packages, wherein mold injection pressure causes the mold compound to flow from a first end of the strip of interconnects, across the strip of interconnects and to a second end of the strip of interconnects, and the mold shields impede the flow of the mold compound through regions of the strip of interconnects proximate to the mold shields; and laser sawing the strip of IC packages to remove the mold shields and form the IC packages.

9. The method of claim 8, wherein the laser sawing comprises two passes.

10. A method for forming integrated circuit (IC) packages comprising:

mounting dies on a strip of interconnects;

applying wire bonds in regions of the strip of interconnects proximate to mold shields;

adjusting the mold shields of the strip of interconnects;

flowing a mold compound on the strip of interconnects to form a strip of IC packages, wherein mold injection pressure causes the mold compound to flow from a first end of the strip of interconnects, across the strip of interconnects and to a second end of the strip of interconnects, and the mold shields impede the flow of the mold compound through regions of the strip of interconnects proximate to the mold shields; and singulating the strip of IC packages into 7 or more IC packages.

11. The method of claim 10, wherein the mold shields are bent to an angle of between 90 degrees and 85 degrees.

12. The method of claim 11, wherein the mold compound has a thickness of about 1.016 millimeters (mm) on both sides of the strip of interconnects.

13. A method for forming integrated circuit (IC) packages comprising:

mounting dies on a strip of interconnects;

applying wire bonds in regions of the strip of interconnects proximate to mold shields;

bending the mold shields from an angle parallel to a backplane of the strip of interconnects in the strip of interconnects to form an acute angle or a right angle;

flowing a mold compound on the strip of interconnects to form a strip of IC packages, wherein mold injection pressure causes the mold compound to flow from a first end of the strip of interconnects, across the strip of interconnects and to a second end of the strip of interconnects, and the mold shields impede the flow of the mold compound through regions of the strip of interconnects proximate to the mold shields; and singulating the strip of IC packages to form the IC packages.

14. The method of claim 13, wherein the mold shields extend beyond the mold compound.

15. The method of claim 13, wherein the interconnects of the strip of interconnects are spaced about 1.57 mm apart.

16. A strip of integrated circuit (IC) packages comprising:

a strip of interconnects comprising mold shields arranged in a center region of the strips of interconnects, the mold shields forming a right angle or an acute angle;

dies mounted on the strips of interconnects;

wire bonds in the center region of the strips of interconnects; and a mold compound encapsulating the strip of interconnects, wherein the mold shields protrude out of the mold compound.

17. The strip of IC packages of claim 16, wherein the mold compound is plastic.

18. The strip of IC packages of claim 16, wherein a respective IC package of the strip of IC packages includes multiple dies of the dies.

19. The strip of IC packages of claim 18, wherein the wire bonds couple the multiple dies of the respective IC package.

20. The strip of IC packages of claim 16, wherein the IC packages are dual in-line IC packages.

* * * * *